United States Patent
Lin et al.

(10) Patent No.: US 10,658,556 B2
(45) Date of Patent: *May 19, 2020

(54) LED PACKAGE STRUCTURE AND MULTILAYER CIRCUIT BOARD

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Chen-Hsiu Lin, New Taipei (TW); Tsung-Kang Ying, New Taipei (TW); Pin-Feng Hung, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/192,111

(22) Filed: Nov. 15, 2018

(65) Prior Publication Data
US 2019/0088842 A1    Mar. 21, 2019

Related U.S. Application Data

(63) Continuation of application No. 14/886,924, filed on Oct. 19, 2015, now Pat. No. 10,170,673.

(30) Foreign Application Priority Data

Apr. 29, 2015 (CN) .......................... 2015 1 0216745

(51) Int. Cl.
*H01L 33/62* (2010.01)
*H01L 33/52* (2010.01)
(Continued)

(52) U.S. Cl.
CPC ............ *H01L 33/62* (2013.01); *H01L 33/505* (2013.01); *H01L 33/52* (2013.01); *H01L 33/60* (2013.01);
(Continued)

(58) Field of Classification Search
None
See application file for complete search history.

(56) References Cited

U.S. PATENT DOCUMENTS 5,920,117 A * 7/1999 Sono ..................... H01L 23/13
257/666
7,884,286 B2 * 2/2011 Sakamoto ............... H01L 24/18
174/260
(Continued)

*Primary Examiner* — Bilkis Jahan
(74) *Attorney, Agent, or Firm* — Li & Cai Intellectual Property (USA) Office

(57) ABSTRACT

An LED package structure includes a multilayer circuit board, an LED chip, and a cover. The multilayer circuit board has a conductive layer, a first resin layer disposed on the conductive layer, and a first circuit layer disposed on the first resin layer. The first resin layer has a first opening, and a portion of the conductive layer is partially exposed from the first resin layer via the first opening such that a mounting region is exposed. The first circuit layer has a second opening, and the second opening exposes the mounting region. The LED chip is fixed on the mounting region by passing it through the first and second openings, and the LED chip is connected to the first circuit layer by wires. The cover is disposed on the first resin layer and covers the LED chip and the first circuit layer.

20 Claims, 22 Drawing Sheets

(51) Int. Cl.
*H01L 33/60* (2010.01)
*H01L 33/50* (2010.01)
*H05K 1/02* (2006.01)
*H01L 33/48* (2010.01)

(52) U.S. Cl.
CPC .......... *H05K 1/0206* (2013.01); *H01L 33/486* (2013.01); *H01L 2224/48091* (2013.01); *H05K 1/0298* (2013.01); *H05K 2201/10106* (2013.01)

(56) References Cited

U.S. PATENT DOCUMENTS

| | | | |
|---|---|---|---|
| 9,066,422 B2* | 6/2015 | Shimada | H01L 21/486 |
| 10,170,673 B2* | 1/2019 | Lin | H01L 33/62 |
| 2009/0053459 A1* | 2/2009 | Hirose | H01L 23/49811 |
| | | | 428/76 |

* cited by examiner

LED PACKAGE STRUCTURE AND MULTILAYER CIRCUIT BOARD

CROSS-REFERENCE TO RELATED PATENT APPLICATION

This application is a continuation application of co-pending application Ser. No. 14/886,924, filed Oct. 19, 2015, which claims the benefit of priority to China Patent Application No. 201510216745.6, filed on Apr. 29, 2015. The entire contents of which are hereby incorporated by reference and for which priority is claimed under 35 U.S.C. § 119 and § 120.

BACKGROUND OF THE INVENTION

1. Field of the Invention

The instant invention relates to a package structure; in particular, to an LED package structure.

2. Description of Related Art

A conventional LED package structure, a reflecting cup is formed on the lead frames by insert molding. However, the combining strength between the reflecting cup and the lead frames is not enough. Furthermore, the molding equipment is necessary when performing insert molding, so the manufacturing cost cannot be decreased due to the molding equipment.

To improve the abovementioned problems, the inventors strive via industrial experience and academic research to present the instant disclosure, which can improve the mentioned problems.

SUMMARY OF THE INVENTION

An LED package structure is provided in the instant disclosure, the problems of low combining strength and high manufacturing cost can be effectively solved by using a multilayer circuit board in the LED package structure.

The multilayer circuit board of the LED package structure in the instant disclosure is provided with the first resin layer stacked on the conductive layer, such that the LED package structure has a small heat resistance so as to obtain a better light efficiency. The outer surface of the first resin layer is rough enough for effectively increasing the combining strength between the cover and the first resin layer when the cover is bonded on the first resin layer.

Moreover, when the LED chip is mounted on the mounting region, the heat dissipating rate of the LED chip can be increased based on the multilayer circuit board having the thicker conductive layer. The periphery of the first opening and the periphery of the second opening are aligned and arranged around the LED chip to construct a reflecting wall, thereby light efficiency of the LED package structure is enhanced by reflecting light emitted from the LED chip by the reflecting wall.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

Figure 1:
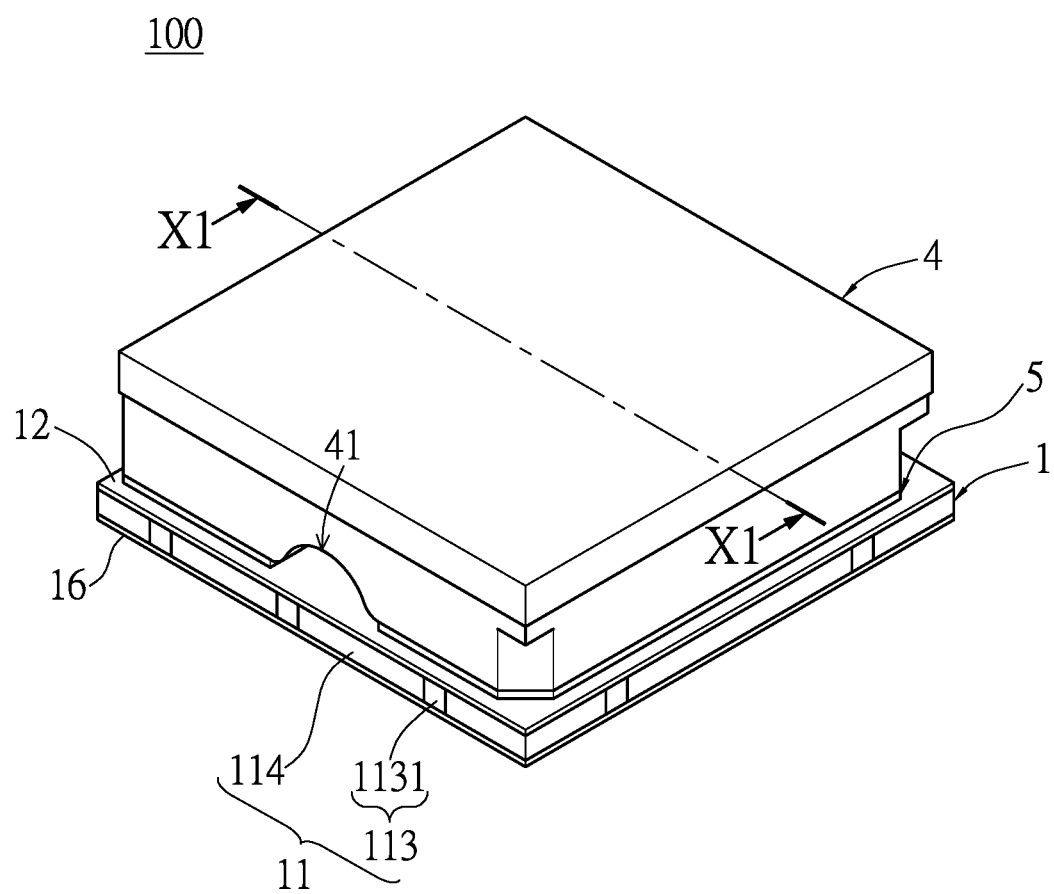
FIG. 1 is a top perspective view showing an LED package structure according to a first embodiment of the instant disclosure.

Please refer to FIGS. 1 through 8, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Please refer to FIGS. 1 through 4, which show an LED package structure 100 of the instant embodiment. The LED package structure 100 includes a multilayer circuit board 1, an LED chip 2, a Zener diode 3, a cover 4, an adhesive 5, and a phosphor sheet 6. The LED chip 2 and the Zener diode 3 are respectively mounted on two different planes of the multilayer circuit board 1, and the cover 4 is fixed on the multilayer circuit board 1 by the adhesive 5. The adhesive 5 can be UV gel, epoxy, or silicone. The construction of the multilayer circuit board 1 is disclosed in the following description, and the relationship between the multilayer circuit board 1 and the other components is also disclosed thereafter.

Please refer to FIGS. 5 through 8, the multilayer circuit board 1 includes a conductive layer 11, a first resin layer 12, a first circuit layer 13, a reflecting layer 14, two first connecting pillars 15 penetrating the first resin layer 12, a second resin layer 16, a second circuit layer 17, and two second connecting pillars 18 penetrating the second resin layer 16. The first resin layer 12, the first circuit layer 13, and the reflecting layer 14 are arranged sequentially above the conductive layer 11. The second resin layer 16 and the second circuit layer 17 are also arranged sequentially under the conductive layer 11.

The conductive layer 11 substantially has a square shape, and a thickness of the conductive layer 11 can be 50~500 µm. The conductive layer 11 has a first conductive portion 111, a second conductive portion 112 separated from the first conductive portion 111, a plurality of extending arms 113 (i.e., the plurality of first extending arms and the plurality of second extending arms) respectively extended from the first and the second conductive portions 111, 112, an insulating portion 114 arranged around a side wall of the first conductive portion 111, a side wall of the second conductive portion 112, and a side wall of each extending arm 113. A top surface of the first conductive portion 111, a top surface of the second conductive portion 112, a top surface of each extending arm 113, and a top surface of the insulating portion 114 are in a coplanar arrangement and are defined as a first surface 115. A bottom surface of the first conductive portion 111, a bottom surface of the second conductive portion 112, a bottom surface of each extending arm 113, and a bottom surface of the insulating portion 114 are also in a coplanar arrangement and are defined as a second surface 116, which is opposite to the first surface 115. That is to say, the top surface of the first conductive portion 111 and the top surface of the second conductive portion 112 are coplanar with a top surface of the insulating portion 114, and the bottom surface of the first conductive portion 111 and the bottom surface of the second conductive portion 112 are coplanar with a bottom surface of the insulating portion 114. The end surfaces 1131 of the plurality of extending arms 113 are flush with a side surface of the insulating portion 114 adjacent thereto, and the end surface 1131 of each extending arm 113 and the side surface of the insulating portion 114 are defined as a surrounding surface 117.

Moreover, the first and second conductive portions 111, 112 are made of metal (for example, copper). The first and second conductive portions 111, 112 are two different rectangular shapes, and the size of the first conductive portion 111 is greater than that of the second conductive portion 112, such that the mounting region 1111 is arranged on the first conductive portion 111. The first conductive portion 111 and the second conductive portion 112 are arranged in parallel with their longer side and are faced with each other. The extending arms 113 (i.e., the first extending arms and the second extending arms) are respectively extended from other sides of the first conductive portion 111 and the second conductive portions 112, which are not faced with each other. One side of the first conductive portion 111 and one side of the second conductive portion 112, which are faced with each other and have no extending arm, are connected by the insulating portion 114, thereby the relative position of the first and second conductive portions 111, 112 can be maintained by the insulating portion 114.

Accordingly, the most part of the surrounding surface 117 of the conductive layer 11 is occupied by the insulating portion 114, and a little part of the surrounding surface 117 of the conductive layer 11 is occupied by the extending arms 113. Therefore, the cutting area of the metallic material of the conductive layer 11 can be reduced to avoid generating burr.

Figure 5:
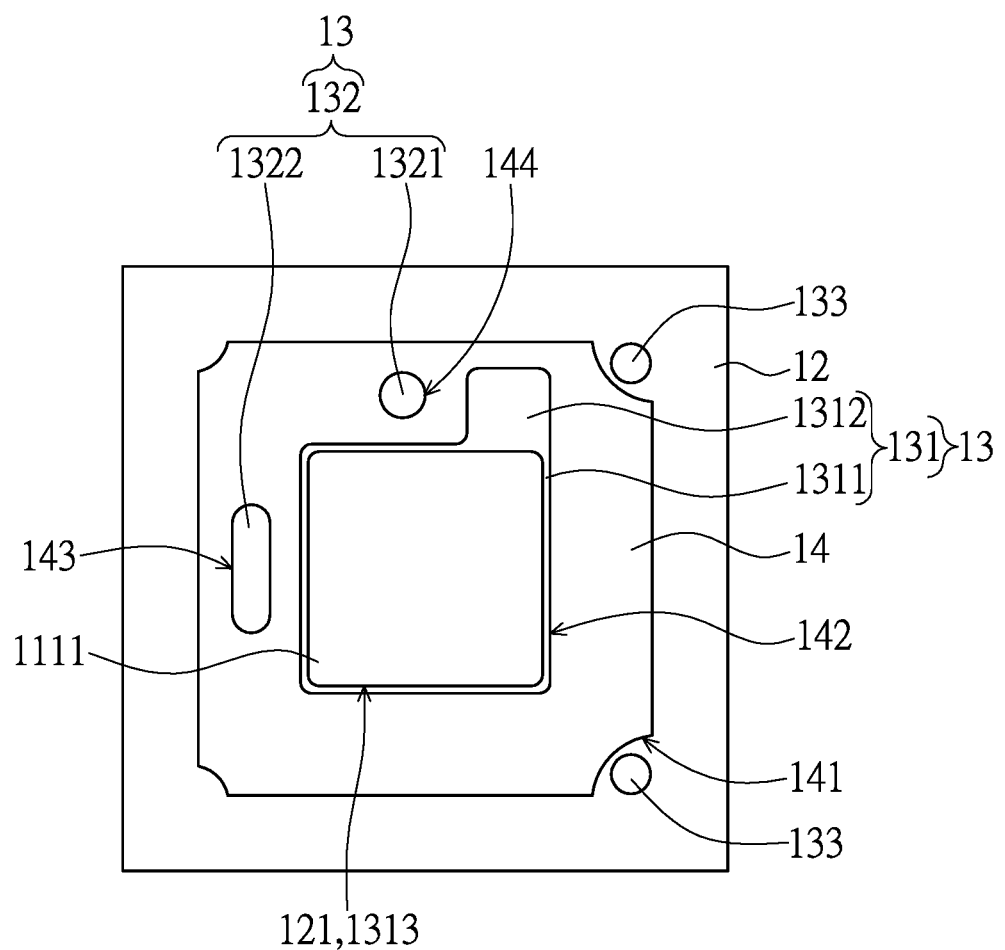
FIG. 5 is a top view of the multilayer circuit board.
Figure 6:
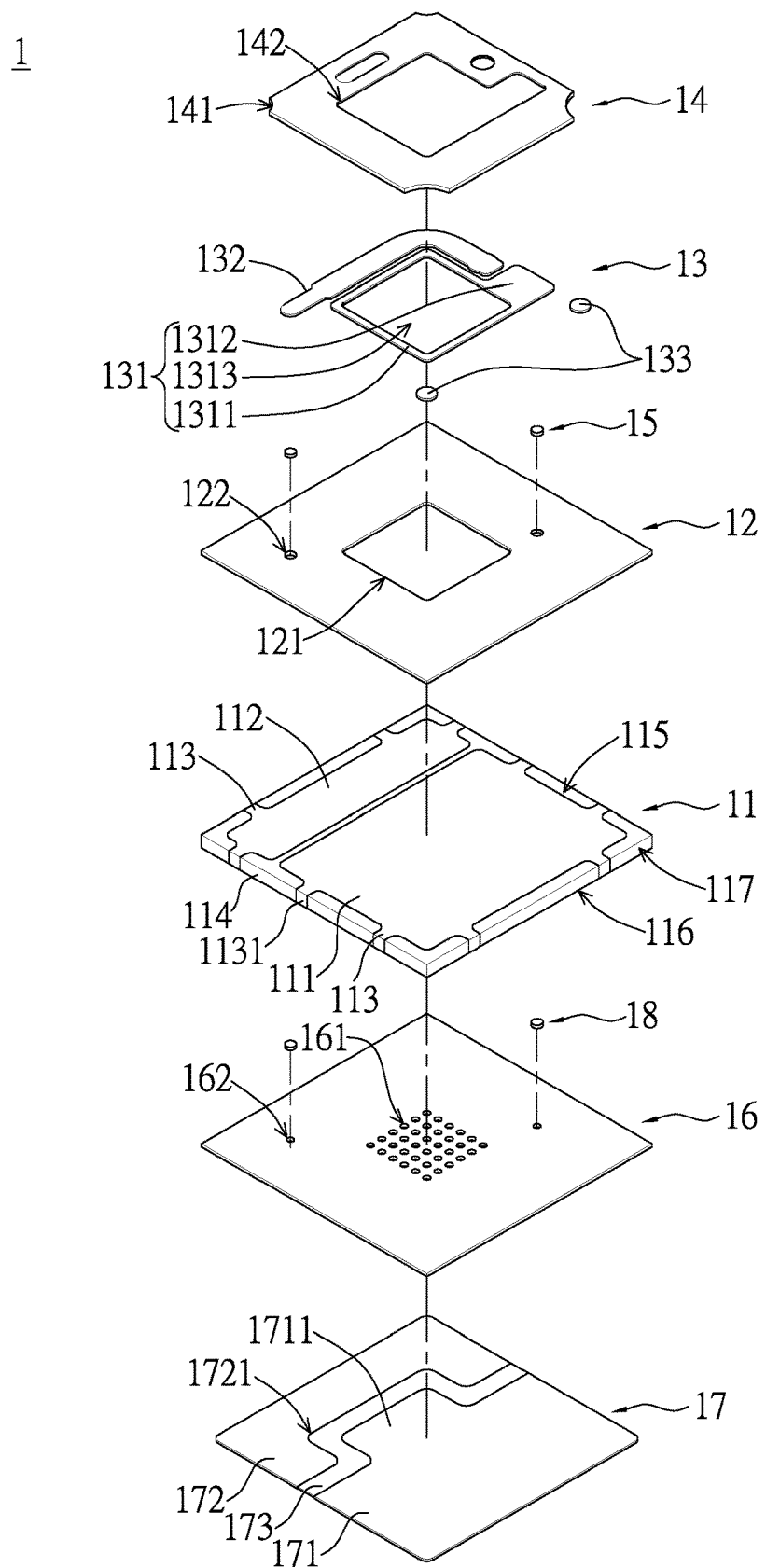
FIG. 6 is a top exploded view of the multilayer circuit board.
Figure 7:
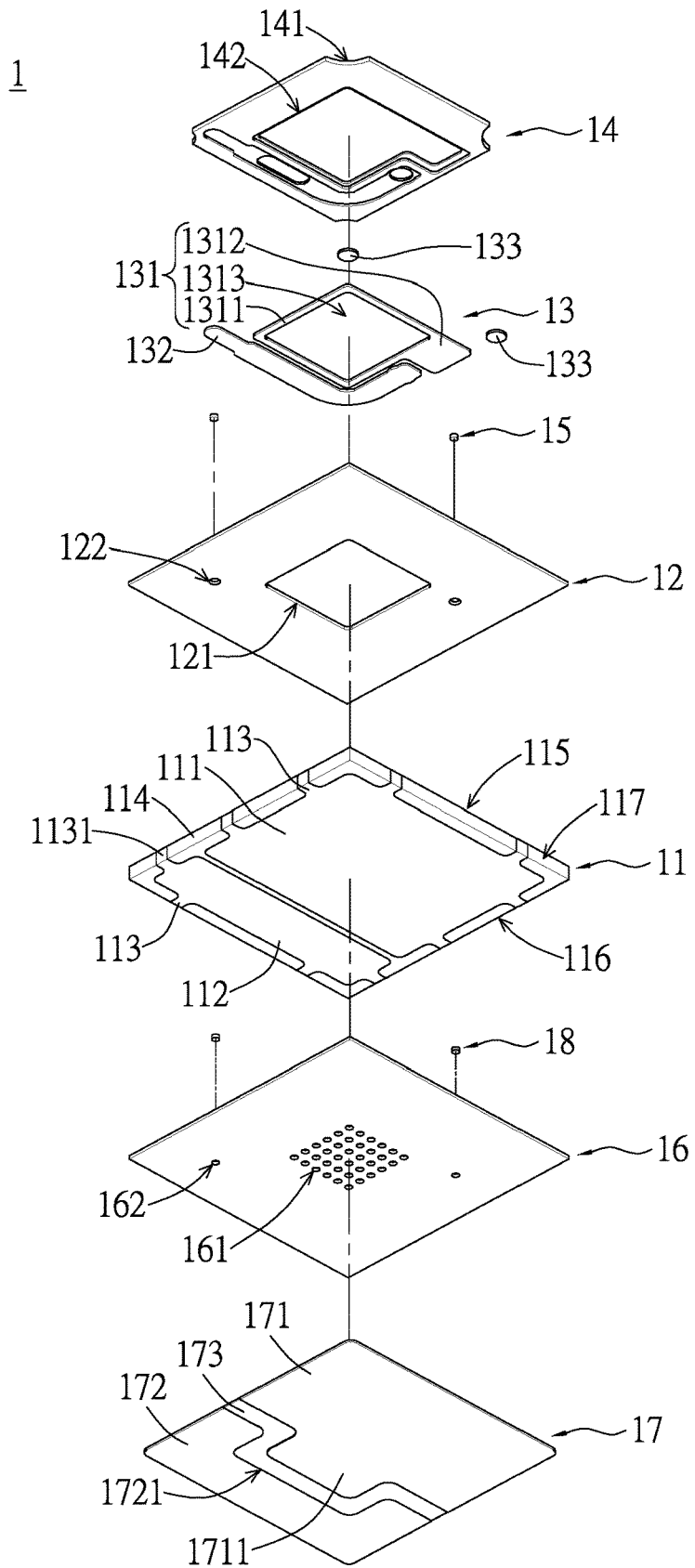
FIG. 7 is a bottom exploded view of the multilayer circuit board.

The first resin layer 12 substantially has a square shape and is made of bismalimides triazine (BT) resin. The first resin layer 12 is disposed on the first surface 115 of the conductive layer 11, and the outer edge of the first resin layer 12 in the instant embodiment substantially is aligned with the outer edge of the conductive layer 11. The first resin layer 12 has a first opening 121 with a square shape and two first thru-holes 122 with a circular shape. The first opening 121 is substantially arranged on the center portion of the first resin layer 12, and part of the first surface 115 of the conductive layer 11 is exposed from the first resin layer 12 via the first opening 121, thereby a mounting region 1111 (as shown in FIG. 5) can be defined. That is to say, the mounting region 111 of the conductive layer 11 is exposed from the first resin layer 12 via the first opening 121, and the mounting region 111 can be defined on the first surface 115. The two first thru-holes 122 are substantially and respectively arranged on two diagonally opposite sides of the first opening 121, and part of the first conductive portion 111 and part of the second conductive portion 112 are exposed through the two first thru-holes 122 respectively.

The first circuit layer 13 is made of metal (for example, copper), and the first circuit layer 13 is disposed on the first resin layer 12. A thickness of the first circuit layer 13 is smaller than that of the conductive layer 11, and the ratio of the thickness of the first circuit layer 13 to the thickness of the conductive layer 11 is 1/4. The first circuit layer 13 has a first electrode 131, a second electrode 132 separated from the first electrode 131, and two circular polarity recognitions 133. The first and second electrodes 131, 132 respectively cover the two first thru-holes 122.

Specifically, the first electrode 131 has a ring portion 1311 and a carrying portion 1312 integrally connected to the ring portion 1311. The ring portion 1311 is substantially a square ring shape. The ring portion 1311 has a second opening 1313 with a square shape. In other words, the second opening 1313 is formed on the first electrode 131 so as to divide the first electrode 131 into the ring portion 1311 and the carrying portion 1312 connected to the ring portion 1311. A periphery of the second opening 1313 is aligned with a periphery of the first opening 121, the second opening 1313 is in position corresponding to the first opening 121, and the size of the second opening 1313 is substantially equal to that of the first opening 121, so that the mounting region 1111 is exposed from the first electrode 131 via the second opening 1313. The carrying portion 1312 in the instant embodiment is a square sheet extended from a corner of the ring portion 1311. Moreover, the second electrode 132 substantially has an L shape, and the corner of the L-shaped second electrode 132 is arranged around another corner of the ring portion 1311.

The light reflectivity of the reflecting layer 14, which corresponds to light having a wavelength of 400~470 nm, is substantially at least 80%. The reflecting layer 14 can be made of solder-resist ink or ceramic ink, and covers part of the first resin layer 12 and part of the first circuit layer 13. The reflecting layer 14 substantially has a quadrilateral shape, and each corner of the reflecting layer 14 is formed with a notch 141, which has a one-quarter arc shape. The outer edge of the reflecting layer 14 substantially is aligned with a bottom side of the cover 4. The two polarity recognitions 133 are disposed on the first resin layer 12, and are respectively arranged in two adjacent notches 141 of the reflecting layer 14 for recognizing the polarity of the LED package structure 100.

Moreover, the reflecting layer 14 has a third opening 142, the third opening 142 is larger than each of the first opening 121 and the second opening 1313, and the first electrode 131 is arranged inside the third opening 142, such that the mounting region 1111 of the conductive layer 11 and the carrying portion 1312 of the second electrode 132 can be exposed from the reflecting layer 14 via the third opening 142. The second electrode 132 have two areas exposed from the reflecting layer 14, and the two exposed areas of the second electrode 132 are respectively defined as a Zener diode wiring area 1321 and an LED chip wiring area 1322. That's to say, a fourth opening 143 and a fifth opening 144 are formed on the reflecting layer 14 to define the Zener diode wiring area 1321 and the LED chip wiring area 1322. The Zener diode wiring area 1321 of the second electrode 132 and the LED chip wiring area 1322 of the second electrode 132 are respectively exposed from the reflecting layer 14 via the fourth opening 143 and the fifth opening 144 (as shown in FIG. 5). The distance between the LED chip 2 and the periphery of the third opening 142 is about 50~300 μm (for example, 150 μm is preferable), thereby increasing the light efficiency of the LED package structure 100.

Accordingly, the reflecting layer 14 having higher light reflectivity covers most of the first circuit layer 13, and only the carrying portion 1312, part of the ring portion 1311, the Zener diode wiring area 1321, and the LED chip wiring area 1322 are exposed from the reflecting layer 14, thereby the light reflecting efficiency has a little influence by the first circuit layer 13.

The two first connecting pillars 15 can be made of copper, and are respectively disposed in the two first thru-holes 122 of the first resin layer 12. Two ends of one of the two first connecting pillars 15 are respectively connected to the first electrode 131 and the first conductive portion 111, and two ends of other one of the two first connecting pillars 15 are respectively connected to the second electrode 132 and the second conductive portion 112.

The second resin layer 16 substantially has a square shape and is made of bismalimides triazine (BT) resin. The second resin layer 16 is disposed on the second surface 116 of the conductive layer 11, and the outer edge of the second resin layer 16 in the instant embodiment is substantially aligned with the outer edge of the conductive layer 11. The second resin layer 16 has a plurality of penetrating holes 161 and two circular second thru-holes 162. The penetrating holes 161 in the instant embodiment are substantially arranged on the center portion of the second resin layer 16 in a matrix arrangement. Specifically, the penetrating holes 161 are substantially arranged under the mounting region 1111. The two second thru-holes 162 are respectively arranged on two diagonally opposite sides of the penetrating holes 161, and part of the first conductive portion 111 and part of the second conductive portion 112 are exposed from by the two second thru-holes 162 respectively.

Figure 2:
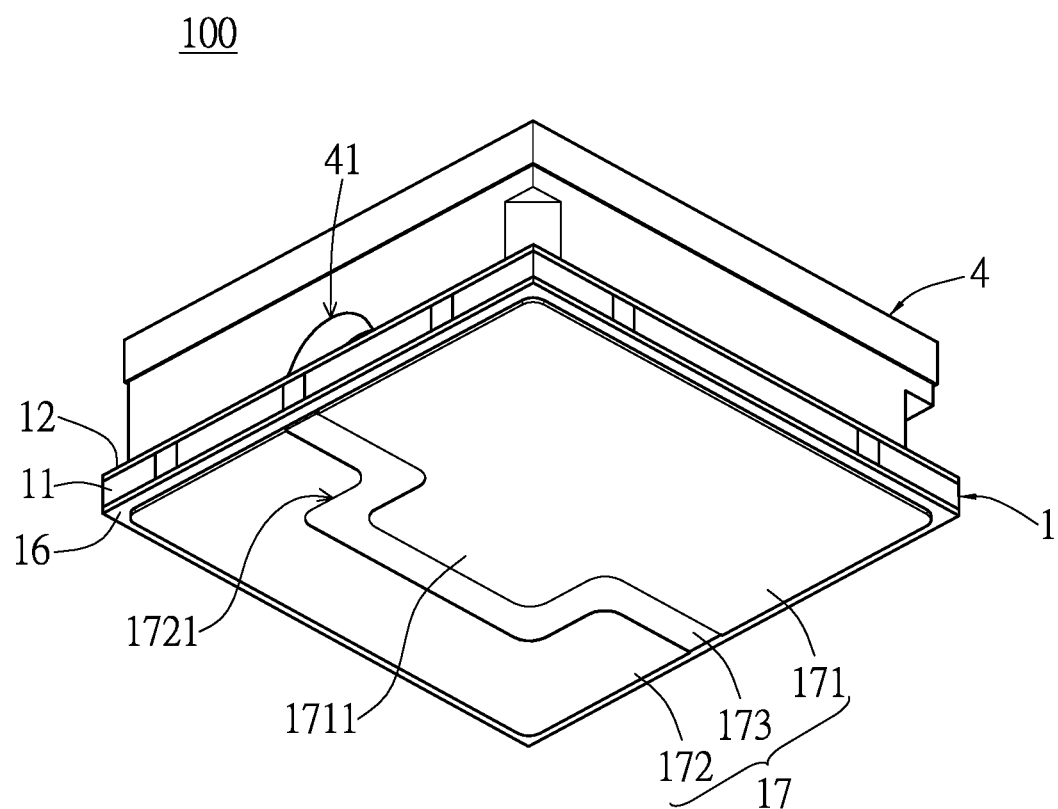
FIG. 2 is a bottom perspective view of FIG. 1.

The second circuit layer 17 substantially has a square shape and is made of metal (for example, copper). The second circuit layer 17 is disposed on the second resin layer 16, and the outer edge of the second circuit layer 17 is arranged inside the outer edge of the second resin layer 16 (as shown in FIG. 2). In other words, an area of the second circuit layer 17 is smaller than that of the second resin layer 16. A thickness of the second circuit layer 17 is smaller than the thickness of the conductive layer 11, and the ratio of the thickness of the second circuit layer 17 to the thickness of the conductive layer 11 is 1/4. The second circuit layer 17 has a first soldering pad 171 and a second soldering pad 172 separated from the first soldering pad 171. The second circuit layer 17 further has an isolation portion 173 arranged between the first and second soldering pads 171, 172 for ensuring the electrical isolation between the first and second soldering pads 171, 172, thereby increasing the reliability of the LED package structure 100. Furthermore, two second thru-holes 162 are covered by the first and second soldering pads 171, 172 respectively.

Specifically, the first soldering pad 171 has a protruding portion 1711, the second welding portion 172 has a concave portion 1721 arranged corresponding to the protruding portion 1711, and the concave portion 1721 surrounds a front part of the protruding portion 1711. The first soldering pad 171 covers all of the penetrating holes 161 of the second resin layer 16, and the protruding portion 1711 covers at least two rows of the penetrating holes 161. In other words, a projecting area defined by orthogonally projecting the mounting region 1111 onto the second circuit layer 17 is entirely arranged on the protruding portion 1711. That is to say, the mounting region 1111 is in position corresponding to the protruding portion 1711. Moreover, the isolation portion 173 covers the adjacent sides of the first and second soldering pads 171, 172 for ensuring the electrical isolation between the first and second soldering pads 171, 172.

Thus, the heat can be rapidly transmitted from the mounting region 1111 to the first soldering pad 171 by forming the penetrating holes 161 of the second resin layer 16 between the mounting region 1111 and the first soldering pad 171, thereby increasing the heat dissipating efficiency of the LED package structure 100. Moreover, by forming the protruding portion 1711 of the first soldering pad 171, the mounting region 1111 can be entirely arranged above the first soldering pad 171, thereby the heat dissipating area and the soldering area of the LED package structure 100 are increased.

The two second connecting pillars 18 are made of metal (for example, copper) and the two second connecting pillars 18 are respectively disposed in the two second thru-holes 162 of the second resin layer 16. Two ends of one of the two second connecting pillars 18 are respectively connected to the first soldering pad 171 and the first conductive portion 111, and two ends of the other one of the two second connecting pillar 18 are respectively connected to the second soldering pad 172 and the second conductive portion 112.

The multilayer circuit board 1 of the instant embodiment has been disclosed in the above description, and the coefficient of thermal expansion (CTE) of the multilayer circuit board 1 can be uniformed by respectively stacking the first and second resin layers 12, 16 on the two opposite surfaces of the conductive layer 11, thereby warpage of the multilayer circuit board 1 can be reduced. The following description discloses the relationship between the multilayer circuit board 1 and the other components.

Figure 3:
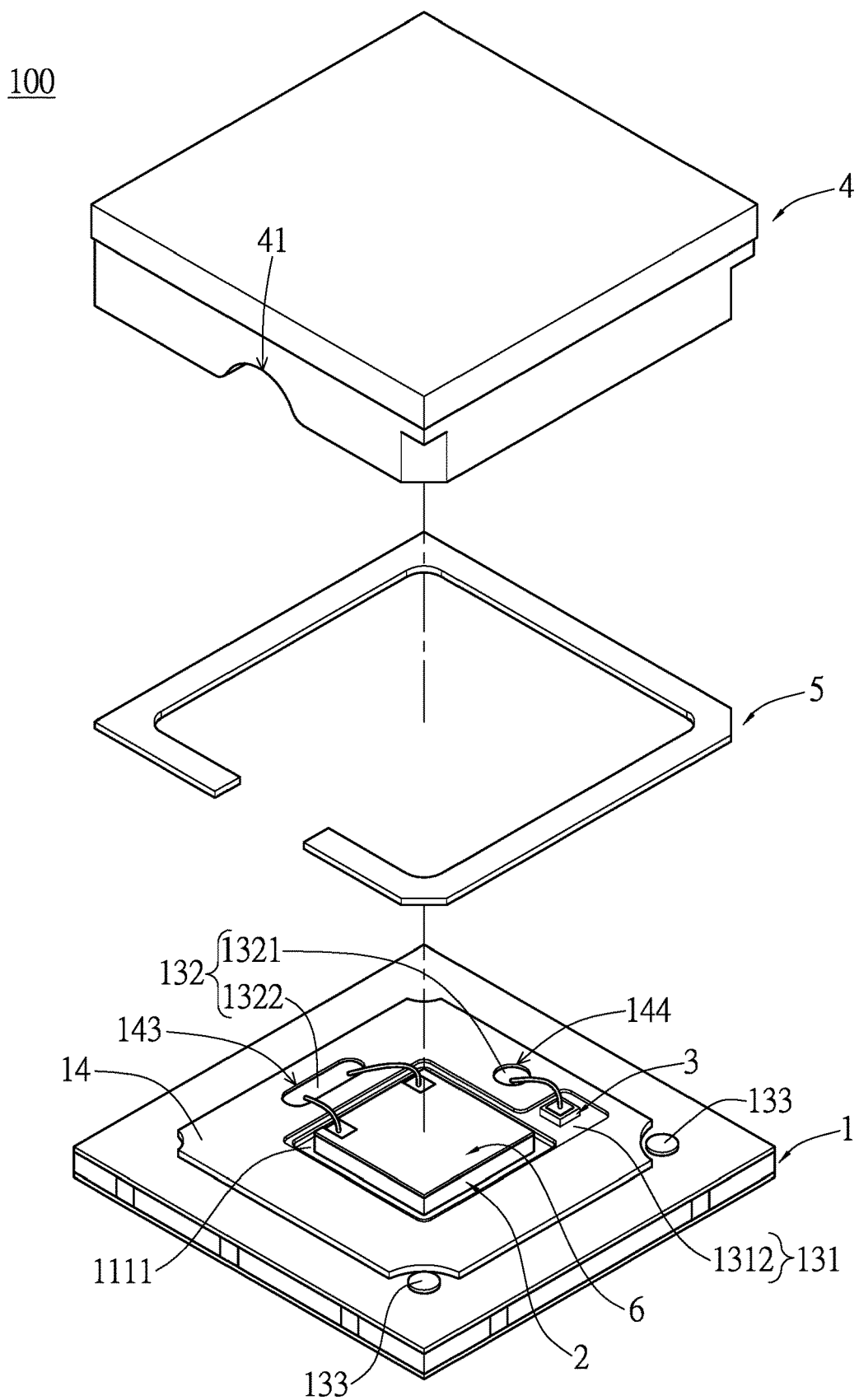
FIG. 3 is an exploded view of the LED package structure.
Figure 4:
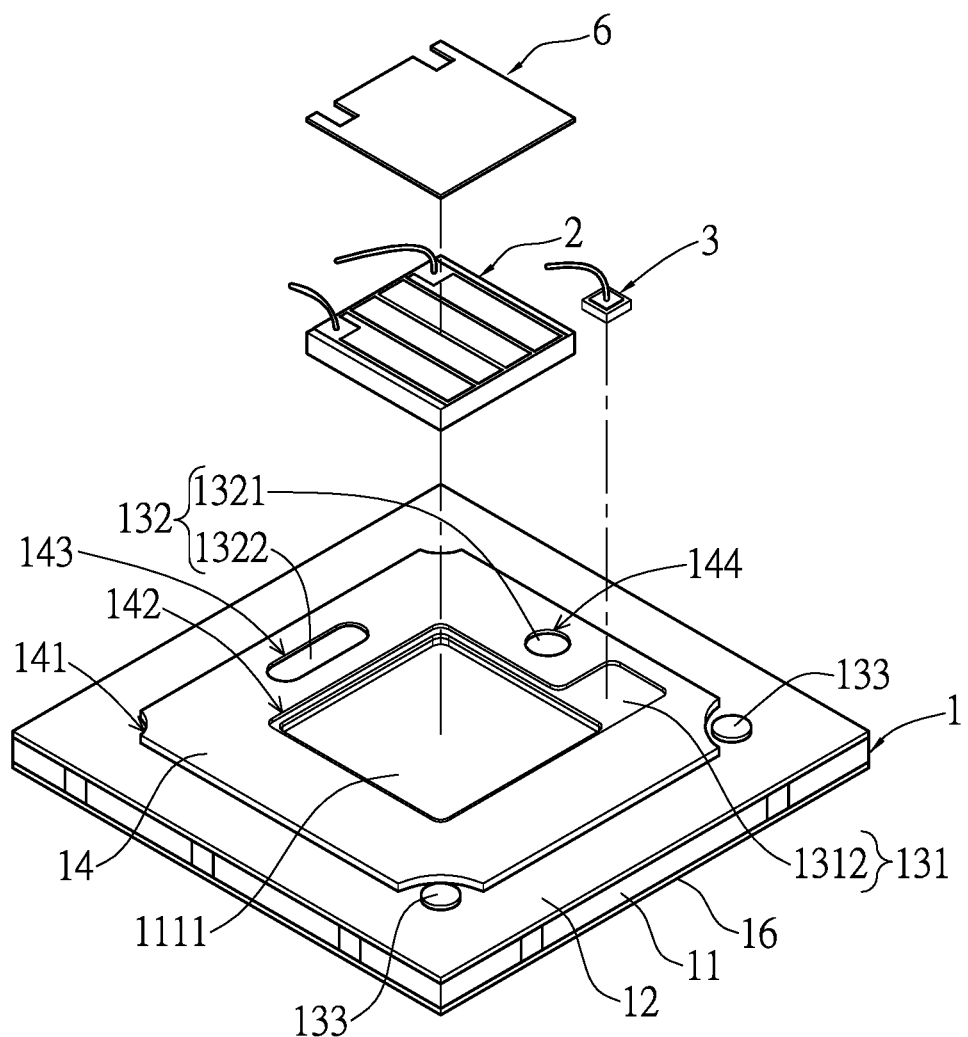
FIG. 4 is an exploded view showing the LED chip, the Zener diode and phosphor sheet, which are separated from the multilayer circuit board.
Figure 8:
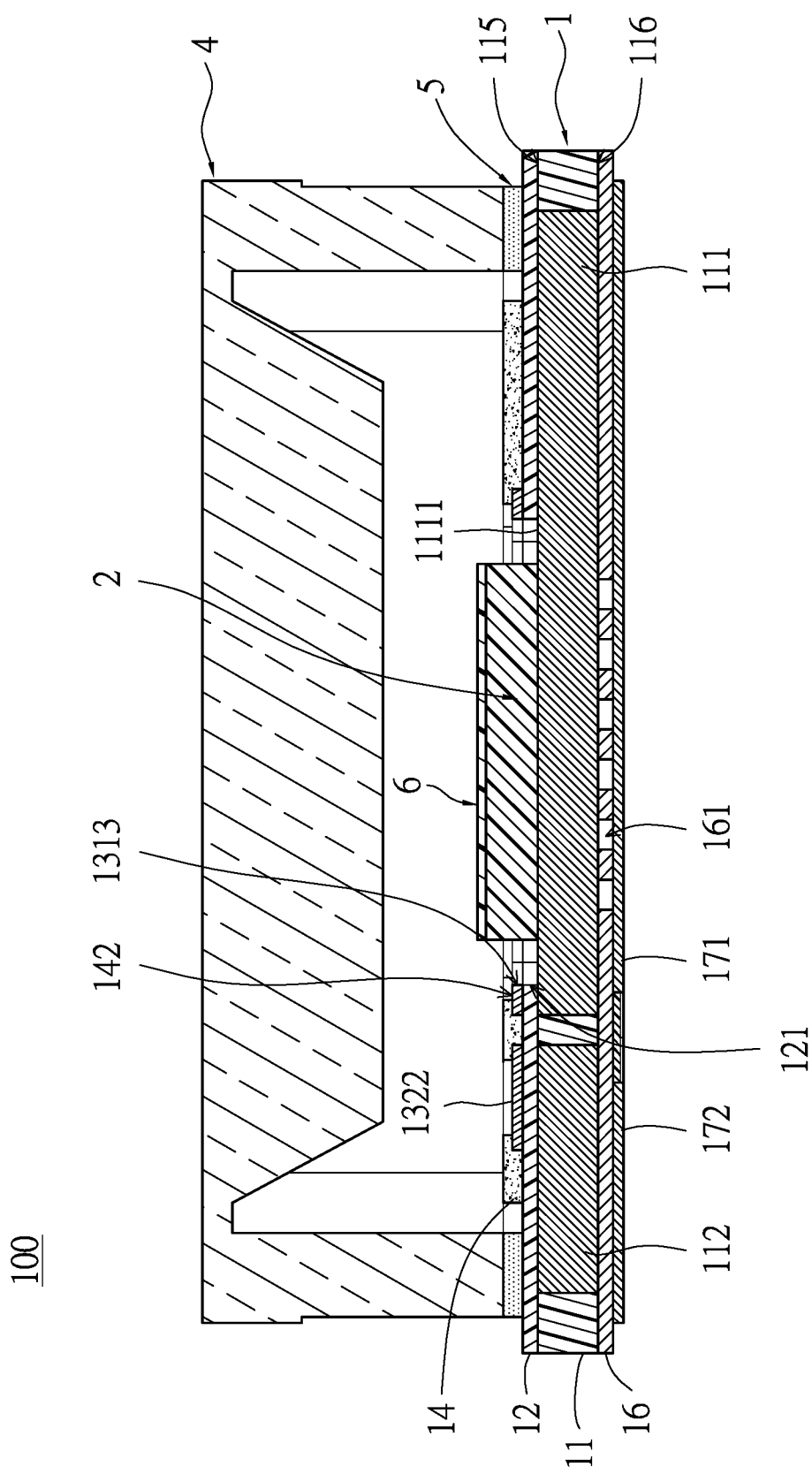
FIG. 8 is a cross-sectional view of FIG. 1 along line X1-X1.

Please refer to FIGS. 3, 4, and 8. The LED chip 2 in the instant embodiment is a vertical chip, but the LED chip 2 is not limited thereto.

Moreover, the LED chip 2 passes through the third opening 142, the second opening 1313, and the first opening 121 so as to mount on the mounting region 1111 of the conductive layer 11 for establishing an electrical connection between the mounting region 1111 of the conductive layer 11 and the bottom portion of the LED chip 2. The height of a portion of the LED chip 2 protruding from the third opening 142 is at least 50% of the height of the LED chip 2. The phosphor sheet 6 is bonded on the top surface of the LED chip 2, and two openings formed on the phosphor sheet 6 are respectively exposing the electrodes of the LED chip 2 for wire bonding, thereby providing the electrodes of the LED chip 2 to respectively establish connections with metallic wires. The electrodes of the LED chip 2 exposed from the notches of the phosphor sheet 6 are electrically connected to the LED chip wiring area 1322 of the second electrode 132 of the first circuit layer 13 by wire bonding.

Thus, when the LED chip 2 is fixed on the mounting region 1111, the heat dissipating rate of the LED chip 2 can be increased based on the multilayer circuit board 1 having the thicker conductive layer 11. Moreover, the periphery of the first opening 121 of the first resin layer 12, the periphery of the second opening 1313 of the first electrode 131, and the periphery of the third opening 142 of the reflecting layer 14 are aligned with each other and arranged around the LED chip 2 to be formed as a reflecting wall (as shown in FIG. 8), thereby reflecting light emitted from the LED chip 2 to increase the light efficiency of the LED package structure 100.

The Zener diode 3 is fixed on the carrying portion 1312 of the first electrode 131, and the Zener diode 3 is electrically connected to the Zener diode wiring area 1321 of the second electrode 132 by wire bonding. Accordingly, the carrying portion 1312 and the mounting region 1111 are arranged on two different planes, and the position of the carrying portion 1312 is higher than the position of the mounting region 1111, so that light efficiency of the LED chip 2 is a little influence by the Zener diode 3 fixed on the carrying portion 1312. Therefore, the light efficiency of the LED chip 2 can be enhanced by arranging the LED chip 2 and the Zener diode 3 on two different planes.

The cover 4 includes a center portion and a surrounding portion surrounding the center portion. The cover 4 is fixed on the first resin layer 12 by the adhesive 5, and the cover 4 covers the LED chip 2, the Zener diode 3, the first circuit layer 13, and the reflecting layer 14. The center portion of the cover 4 is in position corresponding to the LED chip 2. The cover 4 in the instant embodiment can be a lens and is fixed on the first resin layer 12 by a UV adhesive 5, but the manner of fixing the cover 4 on the first resin layer 12 is not limited to the UV adhesive 5. Moreover, the adhesive 5 is disposed on the first resin layer 12 with an open-loop, the open-loop of the adhesive 5 is corresponding to the outline of the cover 4 having the opening 41.

The first resin layer 12 in the instant embodiment is made of BT resin, which has glass fibers, so that the first resin layer 12 has a rough outer surface for effectively increasing the combining strength between the cover 4 and the first resin layer 12 when the cover 4 is bonded on the first resin layer 12. Moreover, when the cover 4 is fixed on the first resin layer 12, each of the notches 141 of the reflecting layer 14 of the multilayer circuit board 1 having the one-quarter arc shape can be used for preventing the combination of the cover 4 and the first resin layer 12 from generating interference.

Specifically, an opening 41, which has a half arc shape, is formed on a bottom edge of the surrounding wall of the cover 4 adjacent to the multilayer circuit board 1. An inner space defined by the cover 4 and the multilayer circuit board 1 is in air communication with an outer space via the opening 41 of the cover 4. The opening 41 of the cover 4 is arranged away from the Zener diode 3. Thus, the inner space of the cover 4 can be in air communication with the outer space by forming the opening 41 of the cover 4, thereby preventing the cover 4 from cracking due to thermal expansion and contraction.

Figure 9:
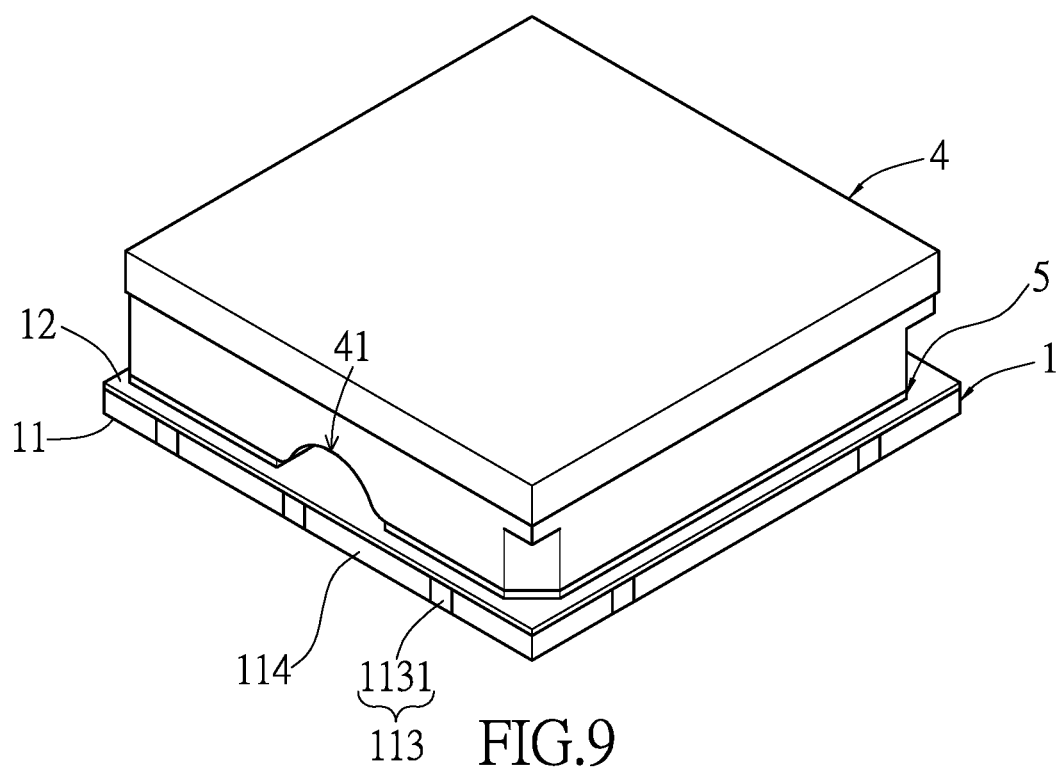
FIG. 9 is a top perspective view showing an LED package structure according to a second embodiment of the instant disclosure.
Figure 10:
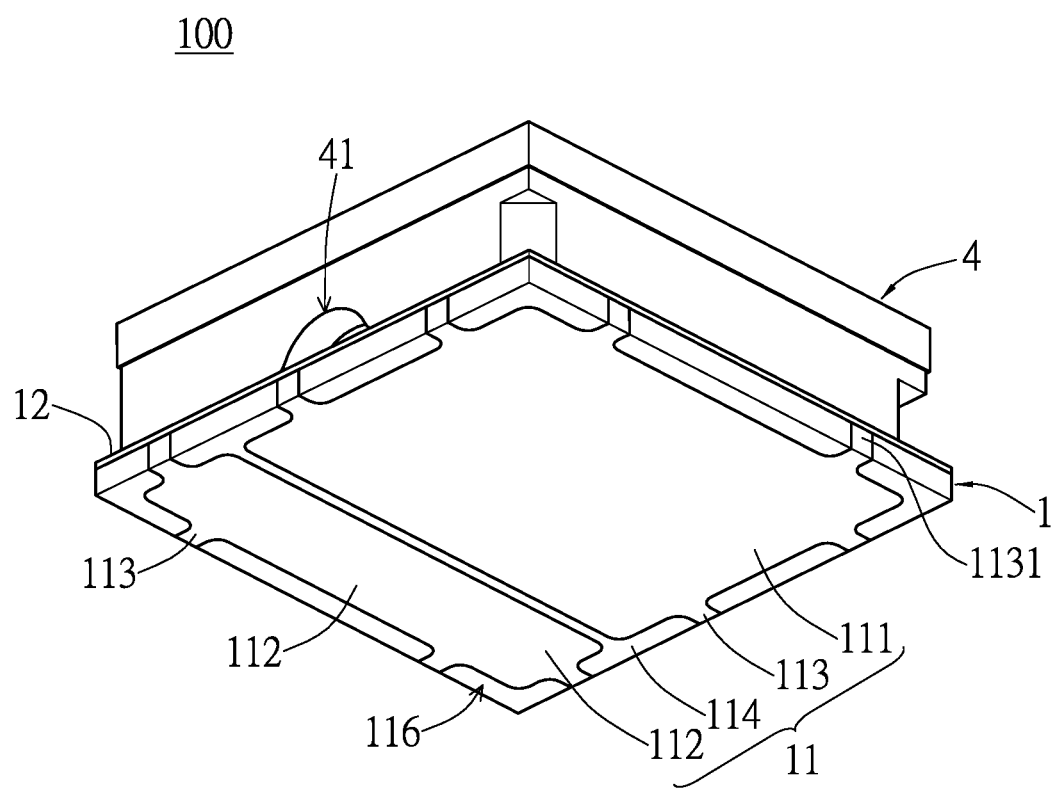
FIG. 10 is a bottom perspective view of FIG. 9.

The LED package structure 100 according to the preferable embodiment of the instant disclosure has been disclosed in the above description, but the LED package structure 100 is not limited thereto. For example, please refer to FIGS. 9 and 10, which show a second embodiment of the instant disclosure. The multilayer circuit board 1 of the LED package structure 100 of the second embodiment is provided without the second resin layer 16 and the second circuit layer 17. In other words, the multilayer circuit board 1 of the second embodiment only includes the conductive layer 11, the first resin layer 12, the first circuit layer 13, and the reflecting layer 14 as disclosed in the first embodiment, and the first conductive portion 111 and the second conductive portion 112 of the conductive layer 11 of the multilayer circuit board 1 in the second embodiment are respectively used as a positive electrode and a negative electrode of the LED package structure 100. Moreover, the multilayer circuit board 1 of the second embodiment, which is provided without the second resin layer 16, only has the first resin layer 12 stacked on the conductive layer 11, so that the second embodiment of the LED package structure 100 has a small heat resistance for obtaining a better light efficiency.

In addition, the construction of the cover 4 can be changed according to designer's request, such as the LED package structures 100 as shown in FIGS. 11A to 14C, which are a third embodiment through a sixth embodiment respectively.

Figure 11A:
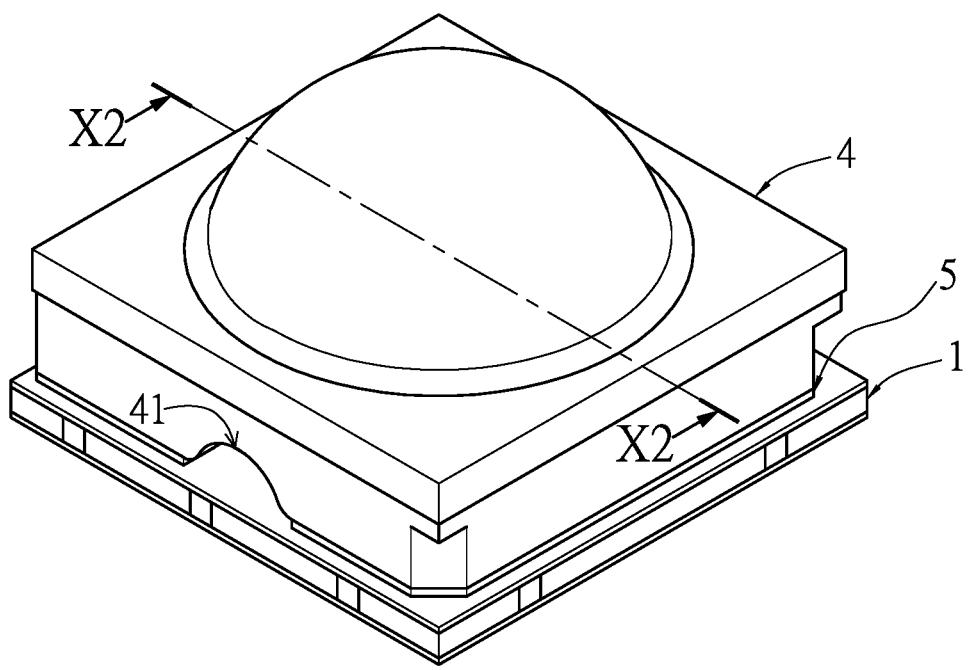
FIG. 11A is a top perspective view showing an LED package structure according to a third embodiment of the instant disclosure.
Figure 11B:
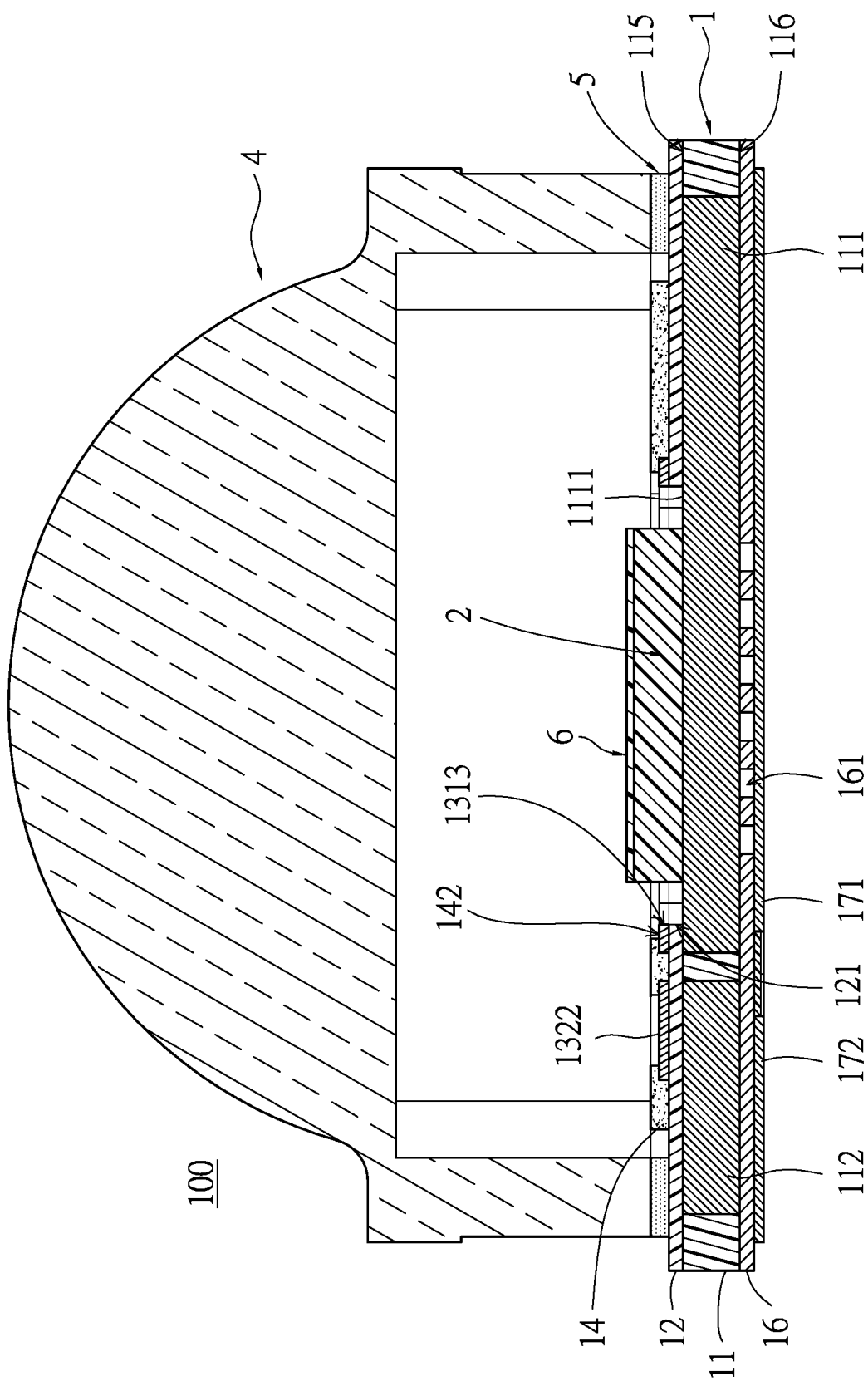
FIG. 11B is a cross-sectional view of FIG. 11A along line X2-X2.
Figure 11C:
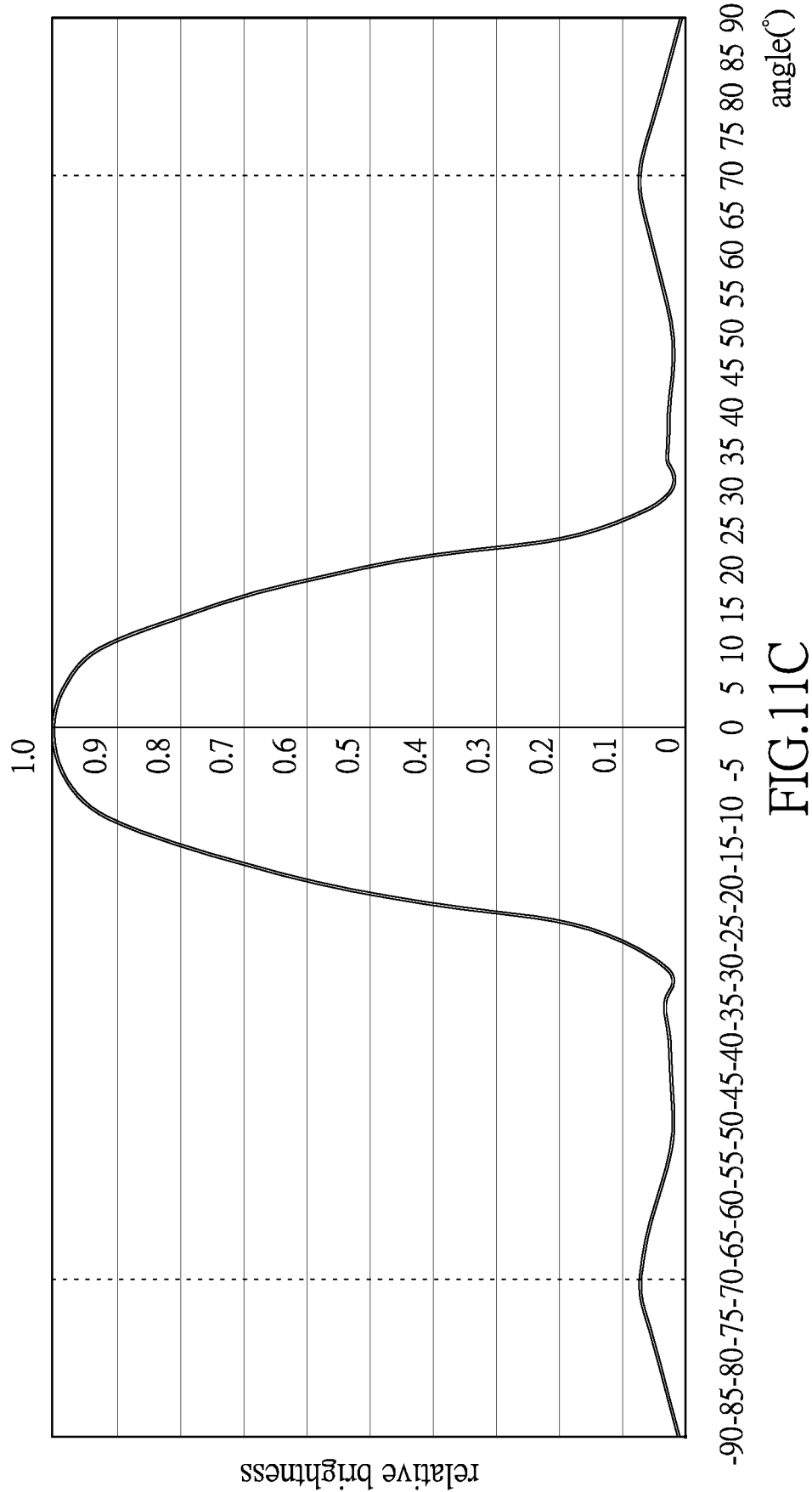
FIG. 11C is a diagram showing the relative brightness versus light-emitting angle of the LED package structure according to the third embodiment of the instant disclosure.
Figure 12A:
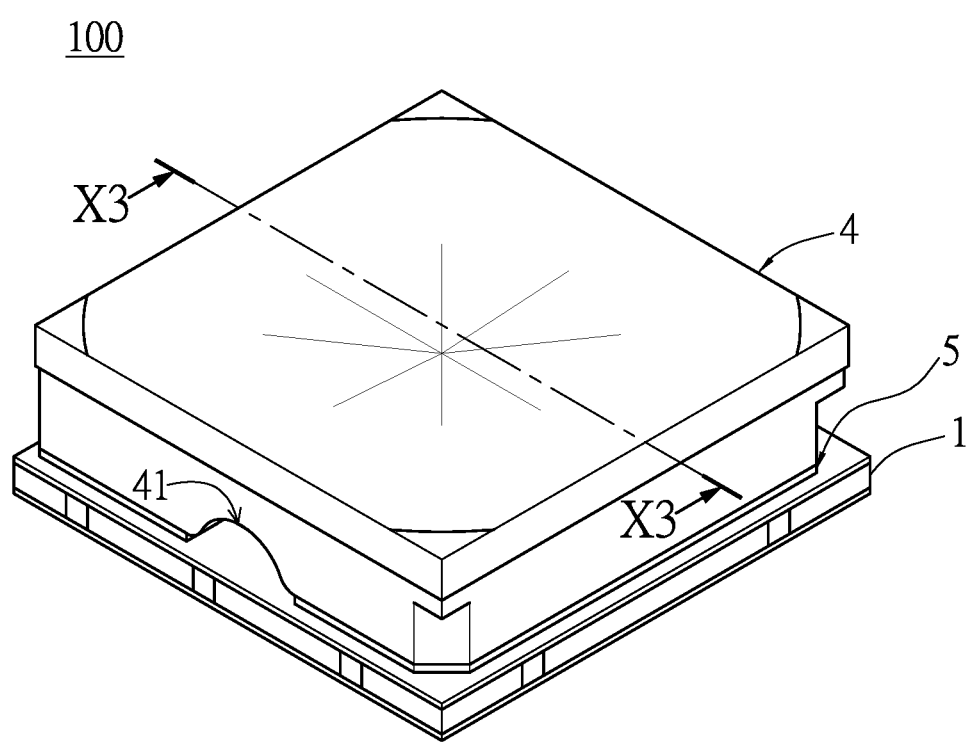
FIG. 12A is a perspective view showing an LED package structure according to a fourth embodiment of the instant disclosure.
Figure 12B:
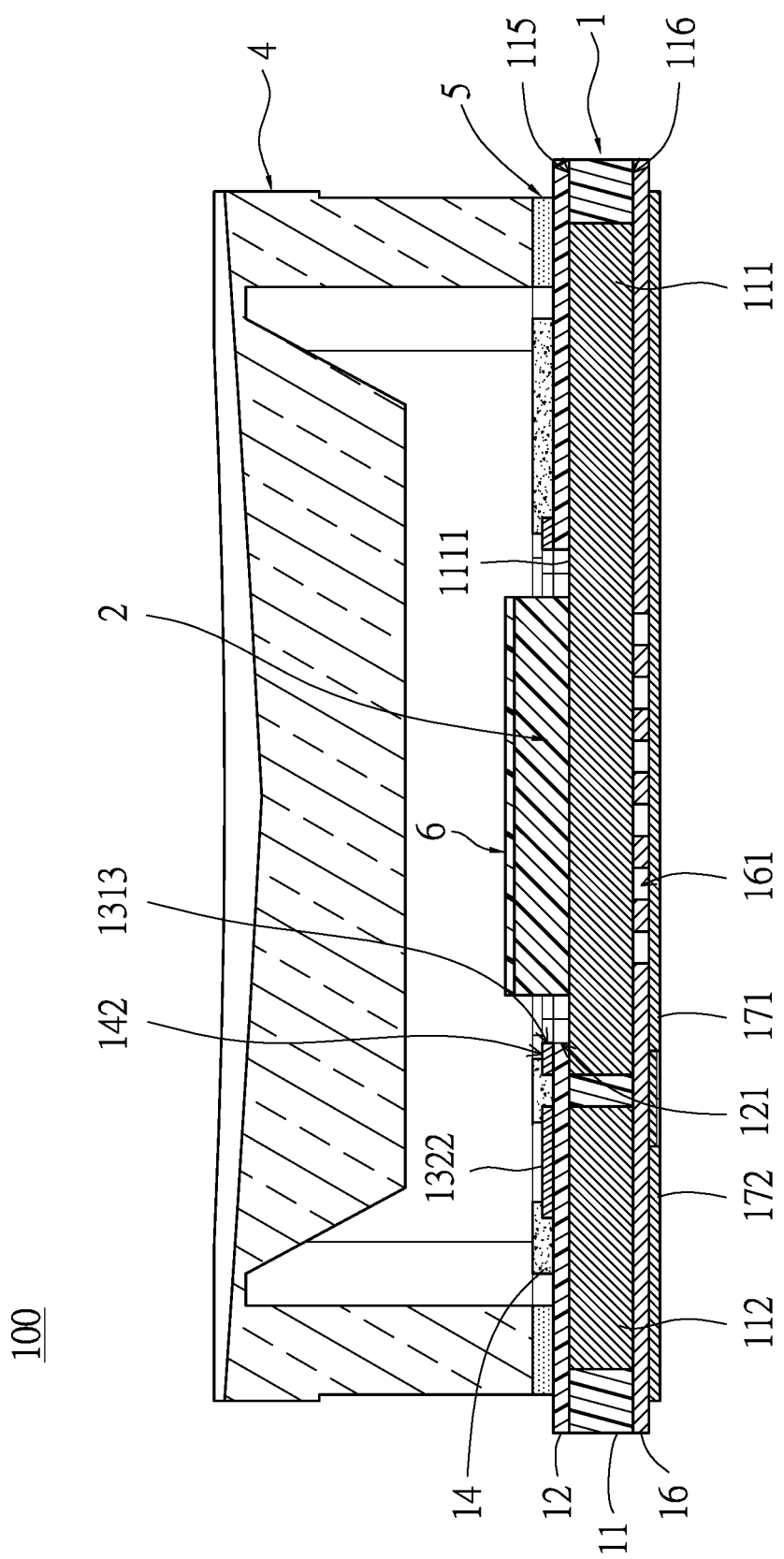
FIG. 12B is a cross-sectional view of FIG. 12A along line X3-X3.
Figure 12C:
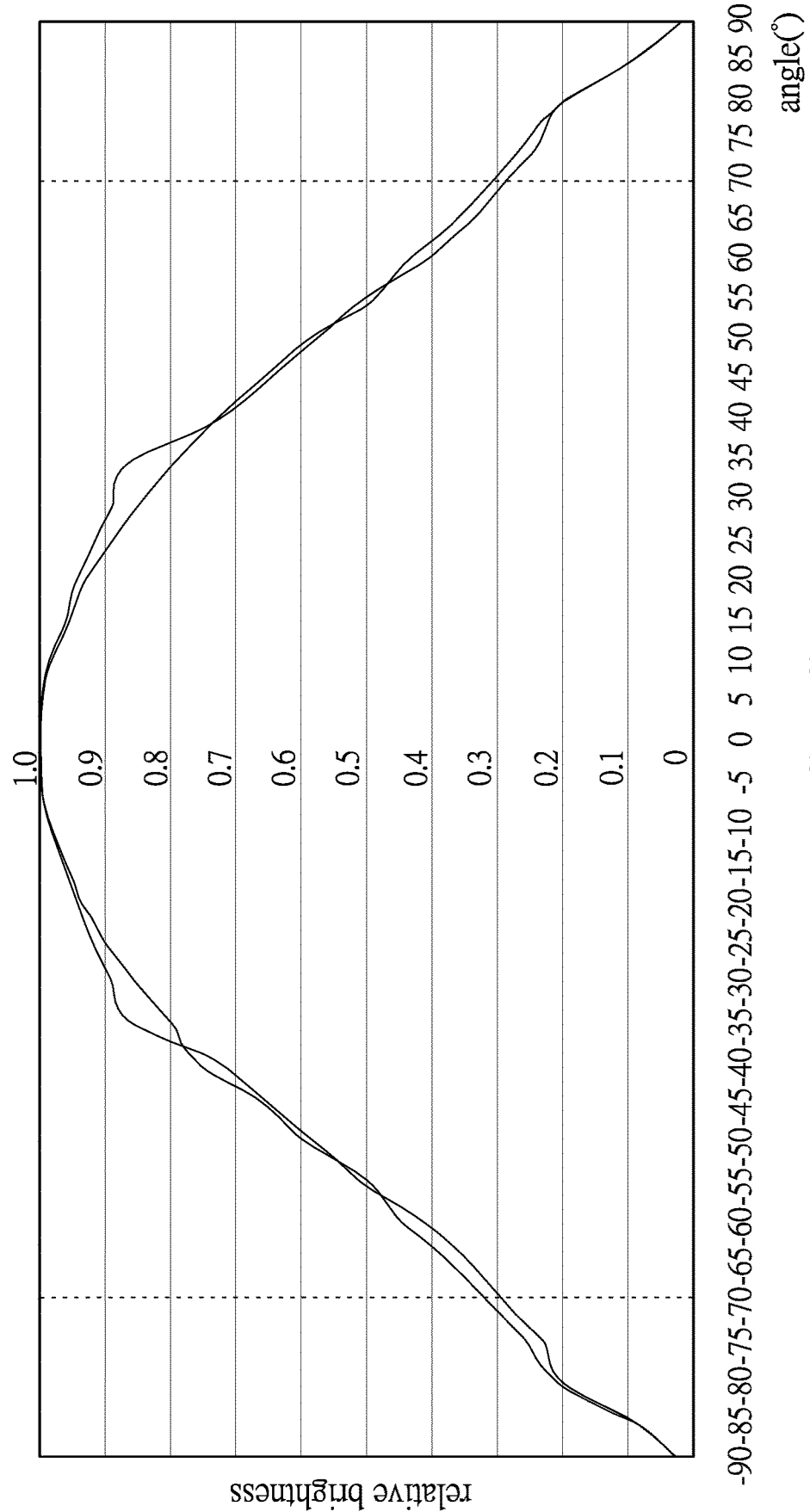
FIG. 12C is a diagram showing the relative brightness versus light-emitting angle of the LED package structure according to the fourth embodiment of the instant disclosure.
Figure 13A:
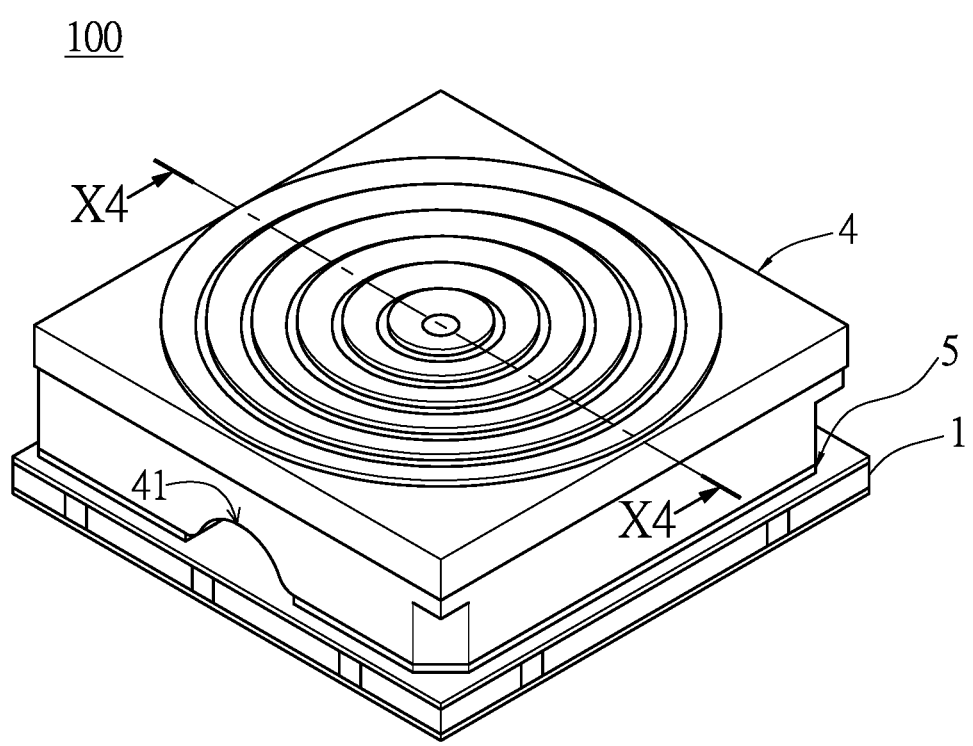
FIG. 13A is a perspective view showing an LED package structure according to a fifth embodiment of the instant disclosure.
Figure 13B:
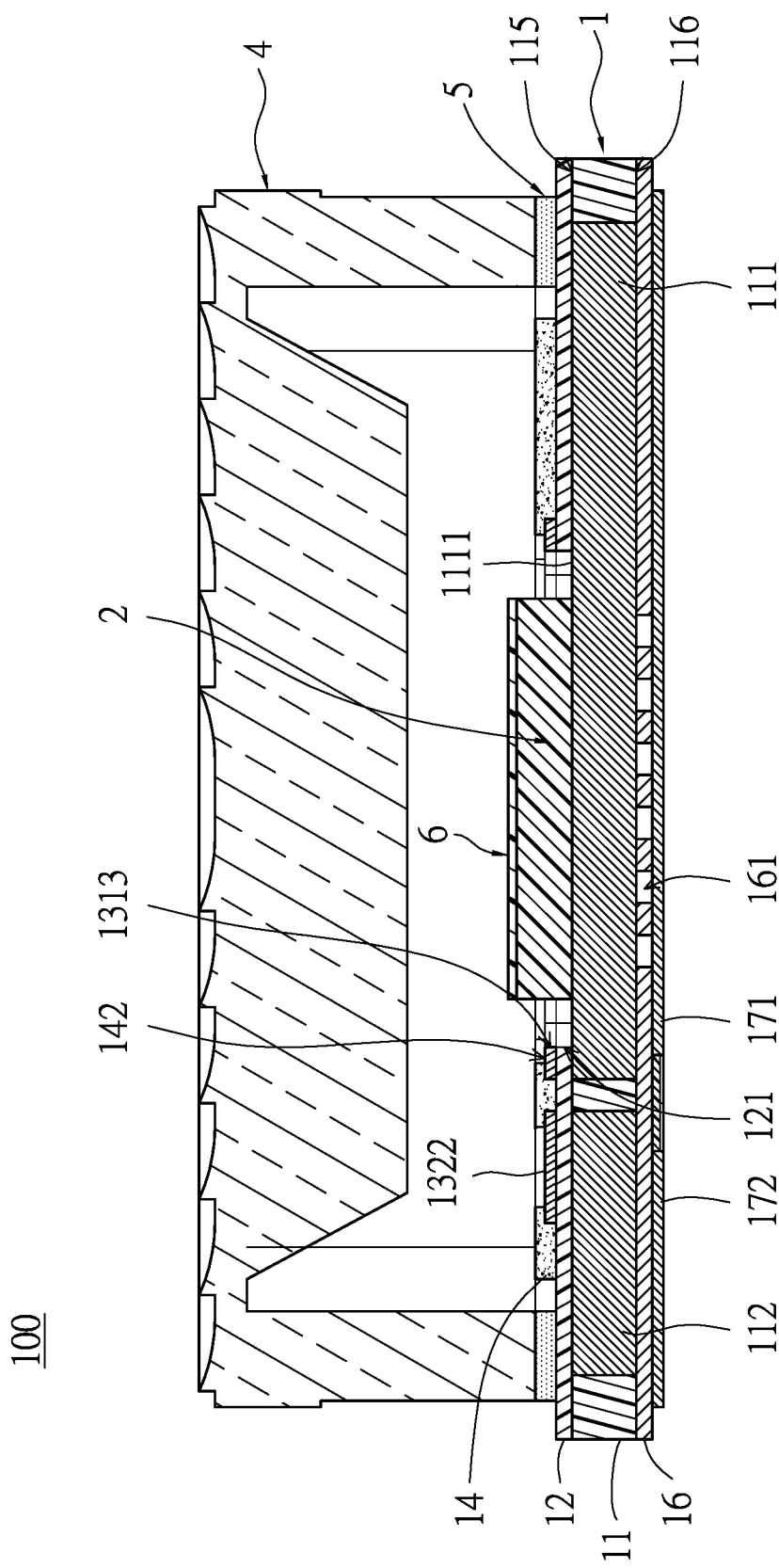
FIG. 13B is a cross-sectional view of FIG. 13A along line X4-X4.
Figure 13C:
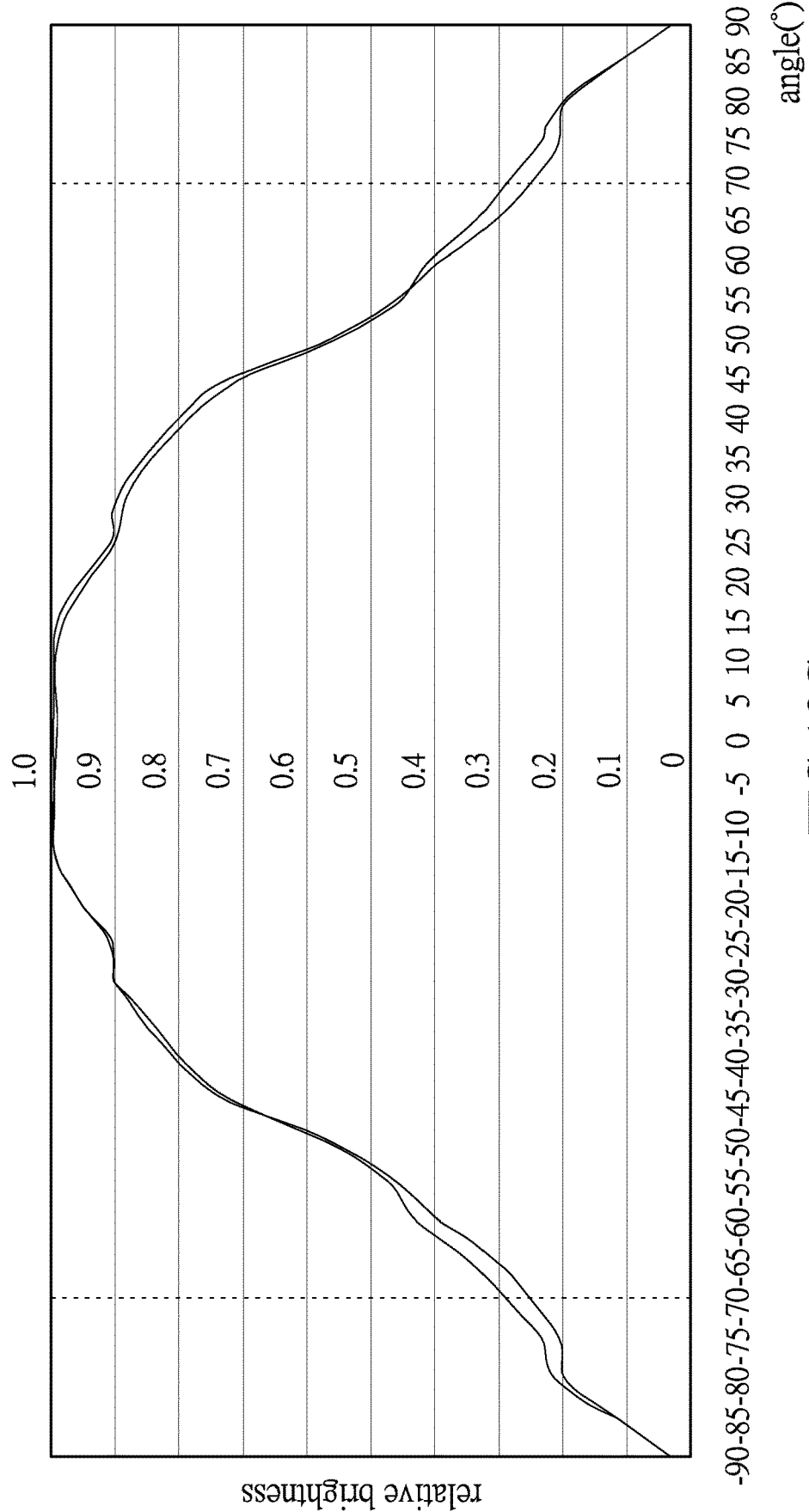
FIG. 13C is a data sheet showing the relative brightness versus light-emitting angle of the LED package structure according to the fifth embodiment of the instant disclosure.
Figure 14A:
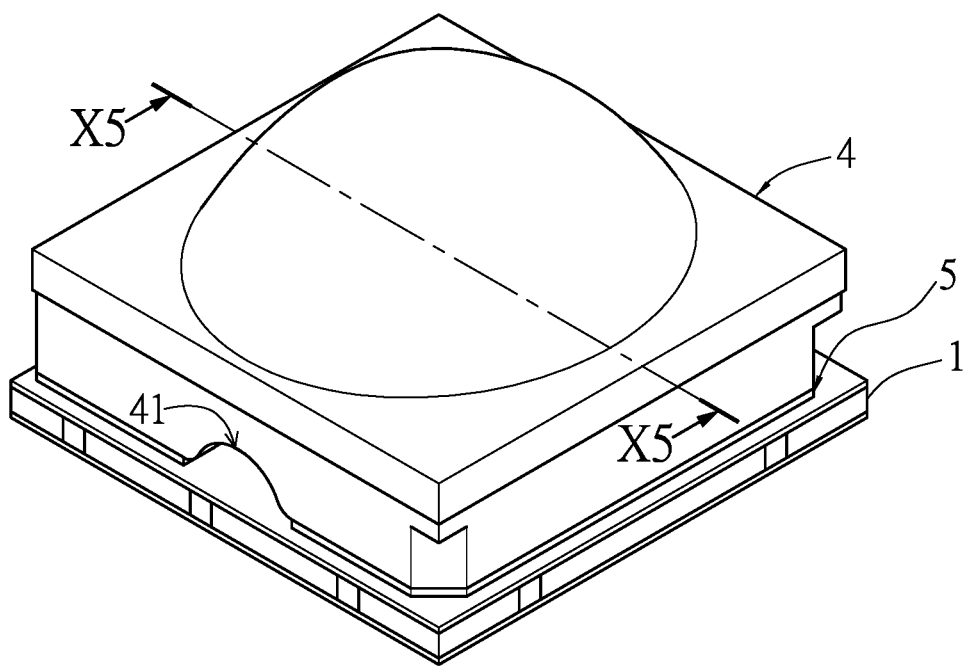
FIG. 14A is a perspective view showing an LED package structure according to a sixth embodiment of the instant disclosure.
Figure 14B:
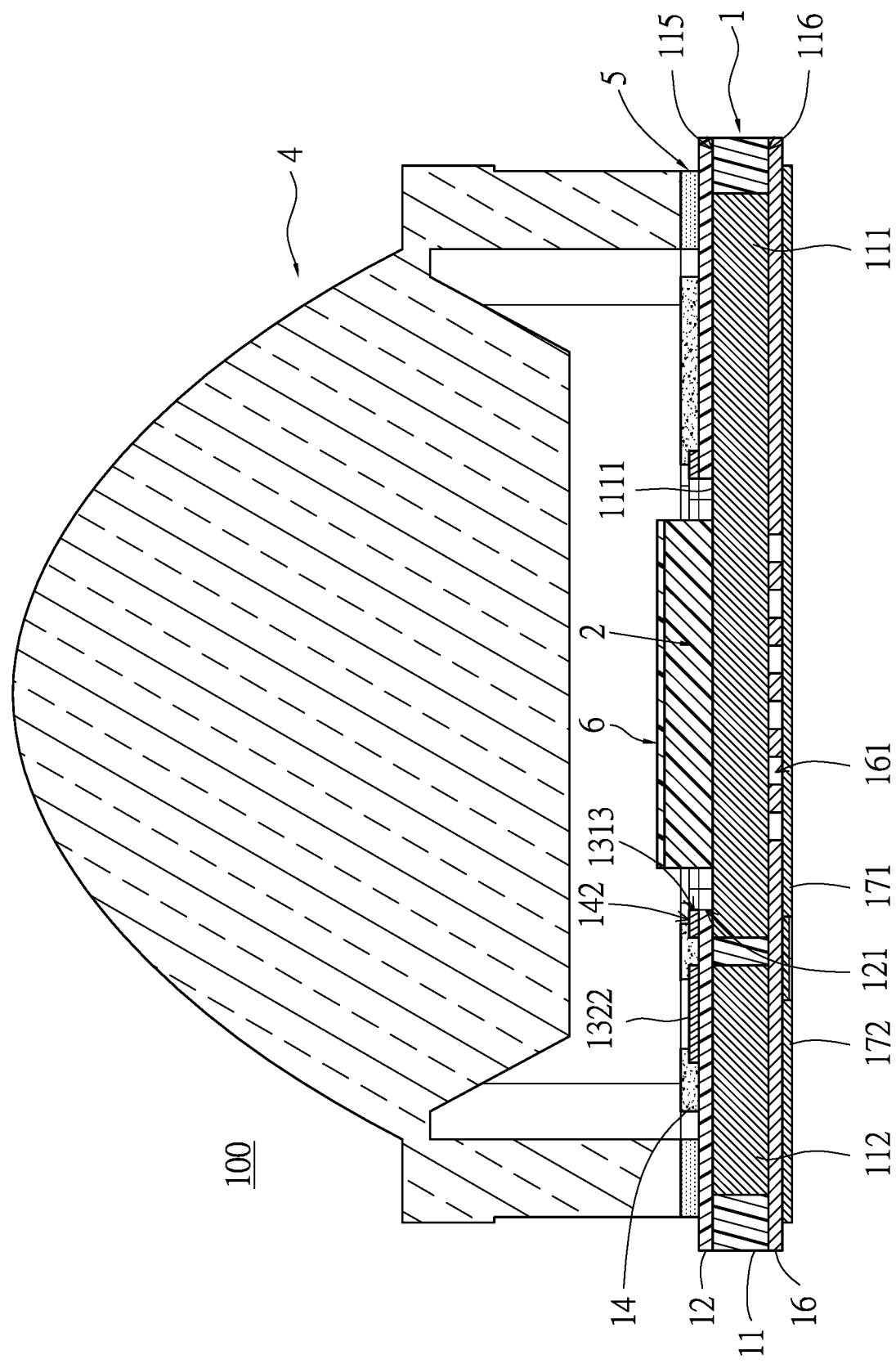
FIG. 14B is a cross-sectional view of FIG. 14A along line X5-X5.
Figure 14C:
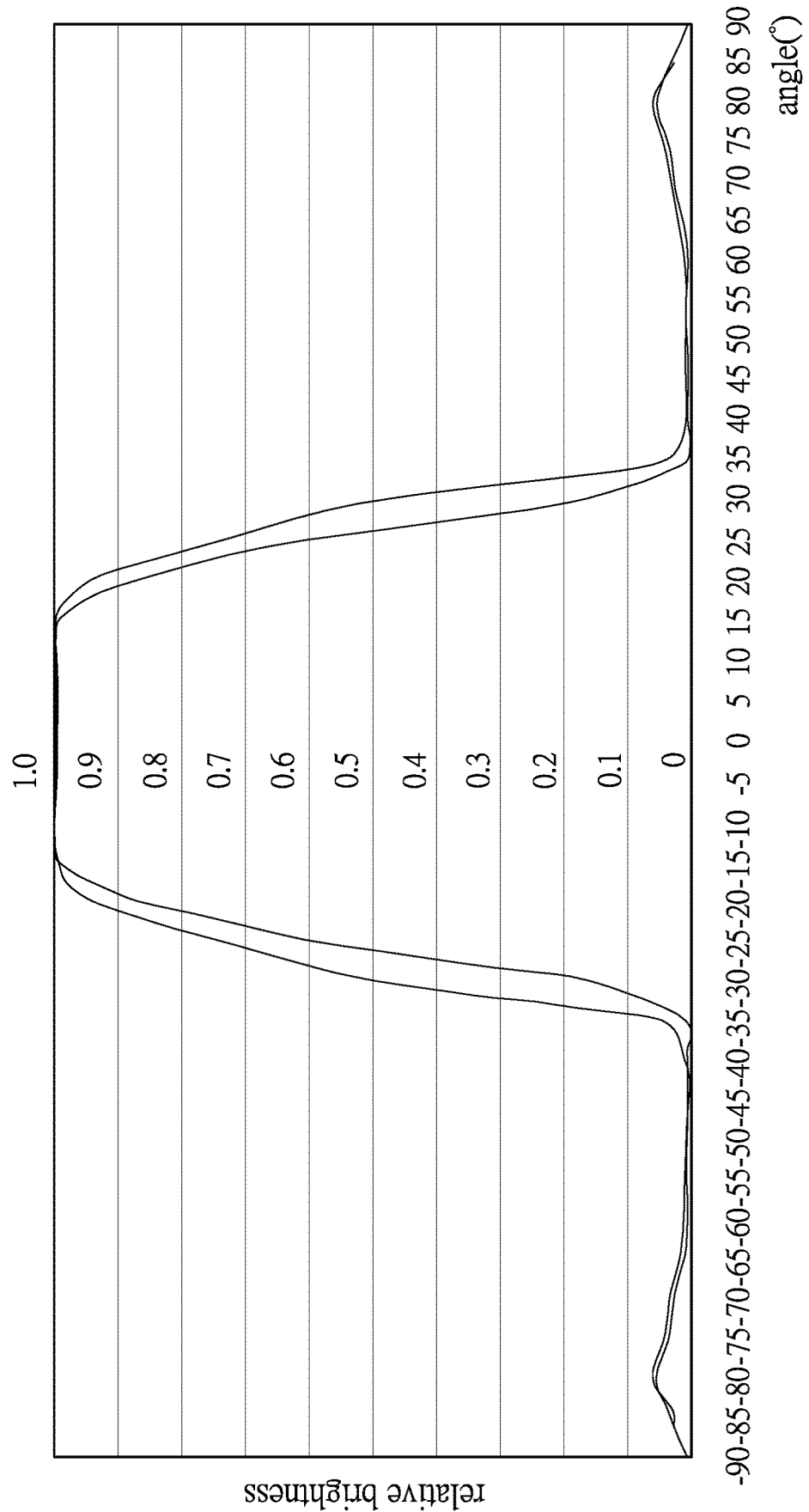
FIG. 14C is a diagram showing the relative brightness versus light-emitting angle of the LED package structure according to the sixth embodiment of the instant disclosure.

Specifically, as shown in FIGS. 11A through 11C, the cover 4 is a plano-convex cover, and the light-emitting angle of the LED package structure 100 in a horizontal or vertical direction is about 41 degrees. As shown in FIGS. 12A through 12C, the cover 4 is a plano-concave cover, and the light-emitting angle of the LED package structure 100 in a horizontal or vertical direction is about 110 degrees. As shown in FIGS. 13A through 13C, the cover 4 is a plano-Fresnel cover, and the light-emitting angle of the LED package structure 100 in a horizontal or vertical direction is about 107 degrees. As shown in FIGS. 14A through 14C, the cover 4 is a plano-convex cover, and the light-emitting angle of the LED package structure 100 in a horizontal or vertical direction is about 52~60 degrees. The cover 4 in each above embodiment has the same light-emitting angle in the horizontal direction and the vertical direction, but a designer can design the cover 4 having two different light-emitting angles in the horizontal direction and the vertical direction respectively. For example, in a non-shown embodiment, the light-emitting angle of the LED package structure 100 in the horizontal direction is about 78 degrees, and the light-emitting angle of the LED package structure 100 in the vertical direction is about 52 degrees. In summary, light uniformity, light-emitting angle, and light efficiency can be influenced due the construction of the cover 4, so the construction of the cover 4 can be changed according to different requests. The cover 4 of the instant disclosure is not limited to the above embodiments, for example, the cover 4 can be formed with complex curvature in single axis or complex curvature in multi-axis.

[The Possible Effect of the Instant Disclosure]

In summary, the LED package structure of the instant disclosure may have the following advantages.

The multilayer circuit board is formed by respectively stacking the first and second resin layers on two opposite surfaces of the conductive layer, such that the coefficient of thermal expansion (CTE) of the multilayer circuit board can be uniform, thereby warpage of the multilayer circuit board can be prevented. The outer surface of the first resin layer is rough for effectively increasing the combining strength between the cover and the first resin layer when the cover is bonded on the first resin layer. Moreover, when the multilayer circuit board only has the first resin layer stacked on the conductive layer as disclosed in the second embodiment, the LED package structure has a small heat resistance for obtaining a better light efficiency.

When the LED chip is fixed on the mounting region, the heat dissipating rate of the LED chip can be increased based on the multilayer circuit board having the thicker conductive layer. Moreover, the wall of the first resin layer defining the first opening, the wall of the first electrode defining the second opening, and the wall of the reflecting layer defining the third opening are aligned with each other and arranged around the LED chip to be formed as a reflecting wall, thereby the light efficiency of the LED package structure can be enhanced by reflecting light emitted from the LED chip via the reflecting wall.

The most part of the surrounding surface of the conductive layer is occupied by the insulating portion 114, and a little part of the surrounding surface of the conductive layer is occupied by the extending arms 113. Accordingly, the cutting area of the metallic material of the conductive layer can be reduced to avoid generating burr.

The reflecting layer covers most of the first circuit layer, and only the carrying portion, part of the ring portion, the Zener diode wiring area, and the LED chip wiring area are exposed from the reflecting layer, thereby the light reflecting efficiency has a little influence due to the first circuit layer.

When the cover is fixed on the first resin layer, each of the notches of the reflecting layer of the multilayer circuit board having one-quarter arc shape can be used for preventing the combination of the cover and the first resin layer from generating interference.

The carrying portion and the mounting region are arranged on two different planes, and the position of the carrying portion is higher than the position of the mounting region, so that the Zener diode fixed on the carrying portion can be configured to avoid influencing the light efficiency of the LED chip.

The heat of the mounting region can be rapidly transmitted to the first soldering pad through the penetrating holes of the second resin layer between the mounting region and the first soldering pad, thereby the heat dissipating efficiency of the LED package structure can be increased. Moreover, the mounting region can be entirely arranged above the first soldering pad by forming the protruding portion of the first soldering pad, thereby the heat dissipating area and the soldering area of the LED package structure can be increased.

The inner space of the cover can be in air communication with the outer space by forming the opening of the cover, thereby a crack of the cover can be prevented due to thermal expansion and contraction.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A multilayer circuit board, comprising:
a conductive layer having a first surface and a second surface opposite to the first surface, a mounting region of the conductive layer being arranged on the first surface, wherein the conductive layer has a first conductive portion and a plurality of first extending arms extending from the first conductive portion;
a first resin layer having two surfaces opposite to each other, wherein one of the two surfaces of the first resin layer is disposed on the first surface of the conductive layer, and has a first opening exposing the mounting region of the conductive layer; and
an insulating portion arranged around a side wall of the first conductive portion and a side wall of each of the first extending arms, wherein an end surface of each of the first extending arms is flush with a side surface of the insulating portion adjacent thereto, a top surface of the first conductive portion is coplanar with a top surface of the insulating portion, and a bottom surface of the first conductive portion is coplanar with a bottom surface of the insulating portion.

2. The multilayer circuit board as claimed in claim 1, further comprising a first circuit layer disposed on the other one of the two surfaces of the first resin layer and having a first electrode and a second electrode separated from the first electrode, the first electrode having a second opening, the second opening exposing the mounting region of the conductive layer.

3. The multilayer circuit board as claimed in claim 2, wherein the first electrode has a ring portion defining the second opening and a carrying portion connected to the ring portion, and the second electrode is disposed near at least one side of the ring portion of the first electrode.

4. The multilayer circuit board as claimed in claim 3, further comprising a reflecting layer having a third opening, a fourth opening, and a fifth opening, wherein the reflecting layer covers part of the first resin layer and part of the first circuit layer.

5. The multilayer circuit board as claimed in claim 4, wherein the mounting region of the conductive layer and a part of the ring portion are exposed from the reflecting layer via the third opening, and two parts of the carrying portion are respectively exposed from the reflecting layer via the fourth opening and the fifth opening.

6. The multilayer circuit board as claimed in claim 1, wherein the conductive layer includes a second conductive portion separated from the first conductive portion by the insulating portion and a plurality of second extending arms extending from the second conductive portion, wherein the insulating portion is arranged around a side wall of the second conductive portion and a side wall of each of the second extending arms, an end surface of each of the second extending arms is flush with the side surface of the insulating portion adjacent thereto, a top surface of the second conductive portion is coplanar with the top surface of the insulating portion, and a bottom surface of the second conductive portion is coplanar with the bottom surface of the insulating portion.

7. The multilayer circuit board as claimed in claim 6, further comprising a first circuit layer disposed on the other one of the two surfaces of the first resin layer and having a first electrode and a second electrode separated from the first electrode, the first electrode having a second opening, the second opening exposing the mounting region of the conductive layer.

8. The multilayer circuit board as claimed in claim 7, wherein the first electrode has a ring portion defining the second opening and a carrying portion connected to the ring portion, and the second electrode is disposed near at least one side of the ring portion of the first electrode.

9. The multilayer circuit board as claimed in claim 8, further comprising a reflecting layer disposed on the first circuit layer and having a third opening, wherein the mounting region of the conductive layer and a part of the ring portion are exposed from the reflecting layer via the third opening.

10. The multilayer circuit board as claimed in claim 9, wherein the reflecting layer has a fourth opening and a fifth opening, and two parts of the carrying portion are respectively exposed from the reflecting layer via the fourth opening and the fifth opening.

11. The multilayer circuit board as claimed in claim 7, further comprising two first connecting pillars penetrating the first resin layer, two ends of one of the two first connecting pillars are respectively connected to the first electrode and the first conductive portion, and two ends of other one of the two first connecting pillar are respectively connected to the second electrode and the second conductive portion.

12. The multilayer circuit board as claimed in claim 6, further comprising:
a second resin layer disposed on the second surface of the conductive layer; and
a second circuit layer disposed on the second resin layer and having a first soldering pad and a second soldering pad that is separated from the first soldering pad.

13. The multilayer circuit board as claimed in claim 12, further comprising two second connecting pillars penetrating the second resin layer, two ends of one of the two second connecting pillars are respectively connected to the first soldering pad and the first conductive portion, and two ends of the other one of the two second connecting pillar are respectively connected to the second soldering pad and the second conductive portion.

14. An LED package structure, comprising:
a multilayer circuit board as claimed in claim 1, wherein the conductive layer of the multilayer circuit board includes a second conductive portion separated from the first conductive portion; and
an LED chip passing through the first opening of the first resin layer and mounted on the mounting region of the conductive layer of the multilayer circuit board, the LED chip being individually electrically connected to the first conductive portion and the second conductive portion.

15. The LED package structure as claimed in claim 14, further comprising a cover disposed on the first resin layer and covering the LED chip.

16. A multilayer circuit board, comprising:
a conductive layer having a first surface and a second surface opposite to the first surface, a mounting region of the conductive layer being arranged on the first surface;
a first resin layer disposed on the first surface and having a first opening, the first opening exposing the mounting region of the conductive layer; and
a first circuit layer separated from the conductive layer through the first resin layer and having a first electrode and a second electrode separated from the first electrode, the first electrode having a second opening, the second opening exposing the mounting region of the conductive layer;
a second resin layer disposed on the second surface of the conductive layer; and
a second circuit layer separated from the conductive layer through the second resin layer and having a first soldering pad and a second soldering pad separated from the first soldering pad, wherein the first electrode is electrically connected to the first soldering pad, and the second electrode is electrically connected to the second soldering pad.

17. An LED package structure, comprising:
a multilayer circuit board as claimed in claim 16; and
an LED chip mounted on the mounting region of the conductive layer of the multilayer circuit board by passing through the first opening and the second opening, the LED chip being individually electrically connected to the first electrode and the second electrode.

18. The LED package structure as claimed in claim 17, further comprising a cover disposed on the first resin layer and covering the LED chip.

19. The LED package structure as claimed in claim 17, the multilayer circuit board includes a reflecting layer disposed on the first circuit layer and having a third opening, wherein the mounting region of the conductive layer and a part of the first electrode are exposed from the reflecting layer via the third opening.

20. The LED package structure as claimed in claim 17, further comprising a Zener diode fixed on the part of the first electrode by passing through the second opening, and the Zener diode is electrically connected to the first electrode and the second electrode.

* * * * *